United States Patent
Edirisooriya et al.

(10) Patent No.: US 10,679,690 B2
(45) Date of Patent: Jun. 9, 2020

(54) METHOD AND APPARATUS FOR COMPLETING PENDING WRITE REQUESTS TO VOLATILE MEMORY PRIOR TO TRANSITIONING TO SELF-REFRESH MODE

(71) Applicant: Intel Corporation, Santa Clara, CA (US)

(72) Inventors: Samantha J. Edirisooriya, Tempe, AZ (US); Shanker R. Nagesh, Bangalore (IN); K L Siva Prasad Gadey N V, Bangalore (IN); Blaine R. Monson, Mesa, AZ (US); Pankaj Kumar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/185,374

(22) Filed: Nov. 9, 2018

(65) Prior Publication Data
US 2019/0147938 A1    May 16, 2019

Related U.S. Application Data

(63) Continuation of application No. 14/816,445, filed on Aug. 3, 2015, now Pat. No. 10,127,968.

(51) Int. Cl.
*G11C 11/406*    (2006.01)
*G11C 7/10*    (2006.01)
(Continued)

(52) U.S. Cl.
CPC ........ *G11C 11/40622* (2013.01); *G06F 1/263* (2013.01); *G06F 1/28* (2013.01);
(Continued)

(58) Field of Classification Search
CPC ............ G11C 11/40622; G11C 7/1072; G06F 13/385; G06F 1/28; G06F 1/263
See application file for complete search history.

(56) References Cited

U.S. PATENT DOCUMENTS

| 5,519,831 A | 5/1996 | Holzhammer |
| 5,805,842 A | 9/1998 | Nagaraj et al. |

(Continued)

FOREIGN PATENT DOCUMENTS

| EP | 1394807 A3 | 9/2004 |
| WO | 2017023467 A1 | 2/2017 |

OTHER PUBLICATIONS

Intel(R) 64 and IA-32 Architectures Software Developer's Manual, Combined vols. 1, 2A, 2B, 2C, 3A, 3B and 3C, Jun. 2015, 33 pages.
(Continued)

*Primary Examiner* — Idriss N Alrobaye
*Assistant Examiner* — Ronald T Modo
(74) *Attorney, Agent, or Firm* — Alliance IP, LLC

(57) ABSTRACT

In one embodiment, an apparatus comprises a processor core and a power control unit. The power control unit is to identify the occurrence of a power loss from a primary power source, instruct the I/O controller to block further write requests from the one or more I/O devices and to send at least one pending write request stored by the I/O controller to the memory controller, and instruct the memory controller to complete at least one pending write request stored by the memory controller and to cause the memory to be placed into a self-refresh mode.

19 Claims, 5 Drawing Sheets

(51) Int. Cl.
*G06F 13/38* (2006.01)
*G06F 1/28* (2006.01)
*G06F 1/26* (2006.01)
*G06F 1/30* (2006.01)

(52) U.S. Cl.
CPC .............. *G06F 1/30* (2013.01); *G06F 13/385* (2013.01); *G11C 7/1072* (2013.01); *G11C 11/40615* (2013.01); *G11C 2211/4067* (2013.01); *Y02D 10/14* (2018.01); *Y02D 10/151* (2018.01)

(56) References Cited

U.S. PATENT DOCUMENTS

| | | | | |
|---|---|---|---|---|
| 6,317,657 | B1* | 11/2001 | George | G06F 1/30 365/222 |
| 7,962,686 | B1* | 6/2011 | Tracht | G06F 13/28 710/260 |
| 2002/0097625 | A1 | 7/2002 | Hashimoto | |
| 2002/0184574 | A1 | 12/2002 | Mackey et al. | |
| 2004/0054937 | A1 | 3/2004 | Williams et al. | |
| 2005/0283648 | A1 | 12/2005 | Ashmore | |
| 2006/0136765 | A1 | 6/2006 | Poisner et al. | |
| 2006/0212651 | A1 | 9/2006 | Ashmore | |
| 2009/0089514 | A1 | 4/2009 | Srivastava et al. | |
| 2010/0095032 | A1* | 4/2010 | Harriman | G06F 13/1626 710/100 |
| 2011/0185103 | A1* | 7/2011 | Evoy | G06F 13/4282 710/313 |
| 2013/0297894 | A1 | 11/2013 | Cohen et al. | |
| 2014/0188829 | A1* | 7/2014 | Ranganathan | G06F 16/21 707/705 |
| 2017/0011799 | A1 | 1/2017 | Lee et al. | |

OTHER PUBLICATIONS

International Search Report and Written Opinion in International Application No. PCT/US2016/040916, dated Oct. 24, 2016, 12 pages.

* cited by examiner

METHOD AND APPARATUS FOR COMPLETING PENDING WRITE REQUESTS TO VOLATILE MEMORY PRIOR TO TRANSITIONING TO SELF-REFRESH MODE

CROSS-REFERENCE TO RELATED APPLICATIONS

This application is a continuation of U.S. patent application Ser. No. 14/816,445, filed on Aug. 3, 2015, and entitled METHOD AND APPARATUS FOR COMPLETING PENDING WRITE REQUESTS TO VOLATILE MEMORY PRIOR TO TRANSITIONING TO SELF-REFRESH MODE. The disclosure of the prior application is considered part of and is hereby incorporated by reference in its entirety in the disclosure of this application.

FIELD

The present disclosure relates in general to the field of computer development, and more specifically, to completing pending write requests to volatile memory prior to transitioning to self-refresh mode.

BACKGROUND

A computer system may include one or more central processing units (CPUs). A CPU may include an integrated memory controller and/or an integrated input/output (I/O) controller. Such an integrated implementation may sometimes be referred to as a System On a Chip (SOC). A CPU may also be coupled to an external I/O controller (i.e., an I/O controller that is not on the same die or package as the CPU) via a bus or other interconnect. A system memory coupled to the CPU may store data utilized by a CPU and/or I/O devices of the computer system. As one example, data stored in the system memory may be consumed by a CPU and/or an I/O device.

A computer system operates using power received from one or more primary power sources such as a battery or electrical outlet. The computer system may experience a power loss in which the computer system ceases to receive power from its primary power source(s). A computer system may include one or more battery backup units to provide limited battery power to some of the components (e.g., the system memory) during the power loss.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below.

Figure 1:
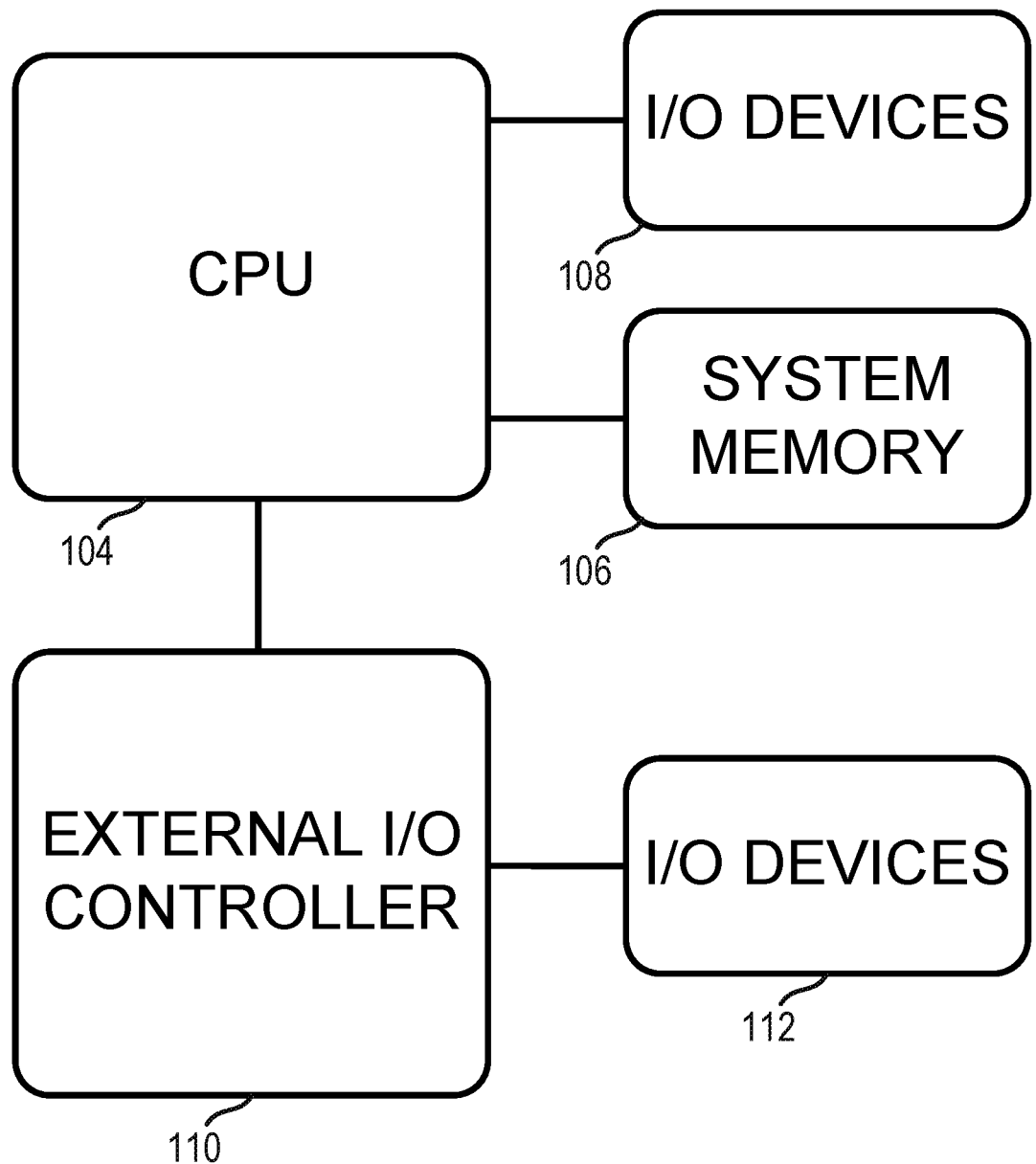
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 104 coupled to a system memory 106 and one or more I/O devices 108. The CPU is also coupled to one or more other I/O devices 112 through external I/O controller 110. During operation, data may be transferred between I/O devices 108 and 112 and the CPU 104. In at least some instances, this data may be stored in system memory 106 before a core or other processing element of the CPU accesses the data. System memory 106 may include volatile memory that requires periodic refreshing in order to maintain data stored therein.

During normal operation, the components of system 100 receive power from a power subsystem that may be coupled to one or more primary power supply sources such as line power, one or more batteries, and/or an Uninterruptible Power Source (UPS). System 100 may experience a power loss in which the system ceases to receive power from its primary power supply source(s). For example, in a system having line power as its primary power supply source, a power loss may occur when an electrical outlet ceases to provide power to the system (e.g., because the outlet loses a connection to power or because a power cord that couples the system to the outlet is unplugged from the system or outlet). As another example, in a system with a battery acting as a primary power supply source, a power loss may occur when the battery ceases to provide power to the system (e.g., the battery does not contain sufficient charge or is detached from the system). In a system having multiple primary power supply sources (e.g., a battery and an electrical outlet), a power loss may occur when none of the primary power supply sources are able to provide power to the system following a period of time when at least one of the primary power supply sources provided power to the system.

In some situations, a power loss may occur during the writing of data received from I/O devices 108 or integrated I/O devices on CPU 104 to the system memory 106. Some applications require the contents of the system memory 106 to be preserved during power loss. In some embodiments, this may be accomplished by coupling the system memory 106 to a backup power source and placing the system memory 106 in a self-refresh mode, where the data stored in system memory 106 is refreshed periodically. In embodiments where the system memory 106 comprises dynamic random-access memory (DRAM), the process of transitioning the system memory 106 to self-refresh mode may be referred to as Asynchronous DRAM Refresh (ADR).

In addition to maintaining the contents of the system memory 106 during power losses, certain applications require that writes targeting system memory 106 are performed in accordance with ordering rules, since a write to system memory 106 from an I/O interface of the CPU can reach the system memory out of order. Thus, in order to avoid problems associated with out of order writes, system 100 may ensure that all writes accepted by CPU 104 are committed to system memory 106, even in the event of a power loss.

Particular systems may utilize software executed by one or more cores of CPU 104 to implement this functionality upon reception of an interrupt supplied in response to a power loss indication. For example, a system management interrupt (SMI) handler could be used to block future writes from the I/O devices and drain the accepted writes to system memory prior to putting the system memory into self-refresh mode. However, such an implementation may require a relatively large backup power source in order to power the entire platform (including one or more cores of a CPU and external I/O controller logic) until the SMI handler completes execution. Moreover, utilization of an SMI handler may require a platform implementer to develop and validate customized software based on the particular implementation of the platform and to predict the amount of power required to execute the software successfully. Moreover, in such a system, there may not be an option to send an indication that the system memory has been placed in self-refresh to logic controlling the backup power source, thus forcing reliance on a timer-based mechanism for activating the provision of power to the system memory by the backup power source.

Various embodiments of the present disclosure include a hardware based flow for completing pending write requests and putting the system memory 106 into self-refresh mode during a power loss. A power control unit (PCU) of CPU 104 may coordinate the quiescence of inbound write data to facilitate the preservation of data in system memory 106 without violating write ordering for inbound writes generated by I/O devices 108 and integrated I/O devices. Various embodiments do not utilize an SMI handler and instructions executed by a core to implement steps of the ADR sequence. Particular embodiments provide various technical advantages, including faster completion of the ADR sequence and reduced power usage (thus decreasing the size of a power source such as a battery used to provide backup power to system 100 during the ADR sequence).

Figure 2:
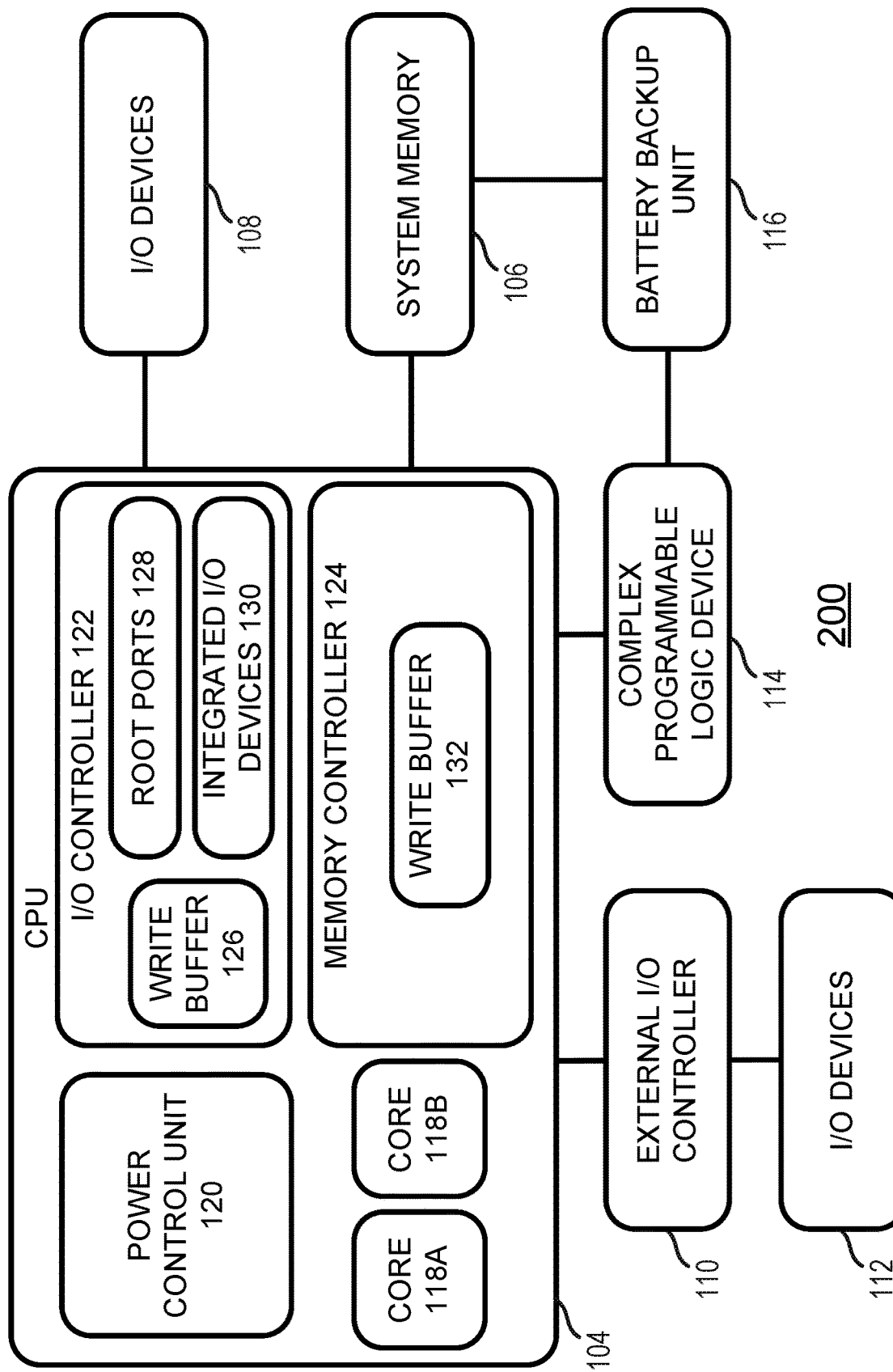
FIG. 2 illustrates a block diagram of components for completing pending write requests and putting memory into self-refresh mode in accordance with certain embodiments.

FIG. 2 illustrates a block diagram of a system 200 for completing pending write requests and putting system memory 106 into self-refresh mode in accordance with certain embodiments. In addition to aspects described below, system 200 may include any suitable characteristics described above with respect to system 100.

In the depicted embodiment, system 200 includes CPU 104 which is coupled to system memory 106, I/O devices 108, external I/O controller 110, and complex programmable logic device (CPLD) 114. Additional I/O devices 112 may be coupled to CPU 104 through external I/O controller 110. System 200 also includes a battery backup unit (BBU) 116 that may provide backup power to system memory 106 in response to a command received from CPLD 114.

CPU 104 includes cores 118, power control unit (PCU) 120, I/O controller 122, and memory controller 124. Each of the I/O controller 122 and the memory controller 124 may include a write buffer 126 and 132 that may be used to store write commands received from I/O devices 108 and/or integrated I/O devices 130 that have been accepted by the I/O controller 122, but not yet written to system memory 106. I/O controller 122 may further include root ports 128. Each of these components is described in more detail below.

In some embodiments, all or some of the elements of system 200 are resident on (or coupled to) the same circuit board (e.g., a motherboard). In particular embodiments, one or more of the I/O devices 108 or 112 are located off of the circuit board and may be coupled to one or more ports of the circuit board. In various embodiments, any suitable partitioning between blocks may exist. For example, the elements depicted in CPU 104 may be located on a single die or package or any of the elements of CPU 104 may be located off-chip. As another example, the CPLD may be located within (e.g., on the same board, die, or package as) external I/O controller 110.

The elements of system 200 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 200, such as cores 118, one or more memory controllers 124, root ports 128, integrated I/O devices 130, direct memory access (DMA) logic (not shown), etc.

CPU 104 may comprise any processor or processing device, such as a microprocessor, an embedded processor, a digital signal processor (DSP), a network processor, a handheld processor, an application processor, a co-processor, a system on a chip (SOC), or other device to execute code. CPU 104, in the depicted embodiment, includes two processing elements (cores 118A and 118B in the depicted embodiment), which may include asymmetric processing elements or symmetric processing elements. However, CPU 104 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical CPU 104, as illustrated in FIG. 2, includes two cores—core 118A and 118B. Here, cores 118 may be considered symmetric cores. In another embodiment, core 118A includes an out-of-order processor core, while core 118B includes an in-order processor core. However, cores 118A and 118B may be individually selected from any type of core, such as a native core, a software managed core, a core adapted to execute a native Instruction Set Architecture (ISA), a core adapted to execute a translated ISA, a co-designed core, or other known core. In a heterogeneous core environment (i.e. asymmetric cores), some form of translation, such as binary translation, may be utilized to schedule or execute code on one or both cores.

Core 118A may include a decode module coupled to a fetch unit to decode fetched elements. Fetch logic, in one embodiment, includes individual sequencers associated with thread slots of cores 118. Usually a core 118 is associated with a first ISA, which defines/specifies instructions executable on core 118. Often machine code instructions that are part of the first ISA include a portion of the instruction (referred to as an opcode), which references/specifies an instruction or operation to be performed. The decode logic may include circuitry that recognizes these instructions from their opcodes and passes the decoded instructions on in the pipeline for processing as defined by the first ISA. For example, as decoders may, in one embodiment, include logic designed or adapted to recognize specific instructions, such as transactional instructions. As a result of the recognition by the decoders, the architecture of core 118 takes specific, predefined actions to perform tasks associated with the appropriate instruction. It is important to note that any of the tasks, blocks, operations, and methods described herein may be performed in response to a single or multiple instructions; some of which may be new or old instructions. Decoders of cores 118A and 118B, in one embodiment, recognize the same ISA (or a subset thereof). Alternatively, in a heterogeneous core environment, decoders of cores 118A and 118B recognize a second ISA (either a subset of the first ISA or a distinct ISA).

In various embodiments, cores 118 may also include one or more arithmetic logic units (ALUs), floating point units (FPUs), caches, instruction pipelines, interrupt handling hardware, registers, or other hardware to facilitate the operations of the cores 118.

System memory 106 may store data that is used by cores 118 to perform the functionality of computer system 200. For example, data associated with programs that are executed or files accessed by cores 118 may be stored in system memory 106. Thus, system memory 106 may store data and/or sequences of instructions that are executed by the cores 118. System memory 106 may be dedicated to CPU 104 or shared with other devices of computer system 200.

System memory 106 may include volatile memory. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in system memory is synchronous dynamic random access memory (SDRAM). In particular embodiments, DRAM of system memory 106 complies with a standard promulgated by the Joint Electron Device Engineering Council (JEDEC), such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). In some embodiments, system memory 106 comprises one or more memory modules, such as dual in-line memory modules (DIMMs). System memory 106 may comprise any suitable type of memory and is not limited to a particular speed or technology of memory in various embodiments.

In various embodiments, system memory 106 comprises DRAM that stores data in cells that each include a capacitor. The data stored by a particular cell is dependent on the amount of charge stored by the cell. The capacitors in the cells of the DRAM will slowly discharge through transistors in the DRAM. The information stored by the capacitors will eventually be lost unless the capacitor charge is periodically refreshed. In some embodiments, a refresh operation may involve restoring the charge on the capacitors of a given row of the DRAM through row activation. In a self-refresh mode, system memory 106 may periodically refresh each of its cells such that it retains the state of data stored therein. In various embodiments, in self-refresh mode, the system memory 106 may retain its data without external clocking (e.g., from memory controller 124) and may utilize an internal timer in conjunction with the refreshing of its cells.

In some embodiments, the implementation of a self-refresh mode by system memory 106 allows data in the memory to be maintained using power from a backup power source, such as a battery backup unit when a power loss occurs. The system memory 106 may be used to store any suitable data, including data that should be preserved, even in the event of a power loss, such as cache configuration data, network data, redundant array of independent disk (RAID) transactions, and/or data associated with other pending transactions. In some embodiments, such data is received through the I/O controller 122 from I/O devices 108 or integrated I/O devices 130.

Memory controller 124 is an integrated memory controller that includes logic (e.g., hardware and/or software) to control the flow of data going to and from the system memory 106. Memory controller 124 may include logic necessary to read from and write to system memory 106 and to cause refreshing of the values stored in system memory 106. During operation, memory controller may select one or more addresses (e.g., row and/or column addresses) of the system memory 106 to read from or write to. Memory controller 124 may receive write requests from cores 118 and I/O controller 122 and may provide data specified in these requests to system memory 106 for storage therein. In the embodiment depicted, memory controller 124 includes write buffer 132. Write buffer 132 may store pending write requests received from an I/O device 108 or 112 that has been accepted by the memory controller 124 but has not yet been written to system memory 106. Memory controller 124 may also read data from system memory 106 and provide the read data to I/O controller 122 or a core 118.

I/O devices 108 may include any suitable devices capable of transferring data to and receiving data from an electronic system, such as CPU 104. For example, an I/O device 108 may be an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In various embodiments, the I/O device 108 may be coupled to CPU 104 and may send data to CPU 104 and receive data from CPU 104. An I/O device 108 may communicate with the I/O controller 122 of the CPU 104 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In the embodiment depicted, I/O devices 108 are located off-chip (i.e., not on the same chip as CPU 104).

I/O controller 122 is an integrated I/O controller that includes logic (e.g., hardware and/or software) for communicating data between CPU 104 and I/O devices 108 and integrated I/O devices 130. Similar to memory controller 124, I/O controller 122 may also include a write buffer 126 to store pending write requests received from an I/O device 108 or integrated I/O device 130 accepted by the I/O controller 122 but not yet passed on to memory controller 124. In the embodiment depicted, I/O controller includes root ports 128 and integrated I/O devices 130.

A root port 128 may couple one or more I/O devices 108 to memory controller 124 and/or a core 118. In various embodiments, a root port may be located in a root complex. For example, the root complex may include an upstream root port and one or more downstream root ports. In particular embodiments, an upstream root port 128 may be coupled to memory controller 124 and/or a core 118 and a downstream root port may couple to an I/O device 108, an integrated I/O devices 130, a switch (which may couple multiple I/O devices 108 or integrated I/O devices to a root port 128), or a bridge that may couple to one or more I/O devices 108 or integrated I/O devices that use a signaling protocol that is different from the protocol used by the root port 128 (e.g., a PCIe bridge to PCI, PCI-X, USB, or other protocol).

I/O controller 122 may also comprise one or more integrated I/O devices 130. An integrated I/O device 130 may have any of the characteristics listed above with respect to I/O devices 108, but is integrated on the same chip as the rest of the CPU.

In various embodiments, a root port 128 or integrated I/O device 130 or similar components on external I/O controller 110 may utilize a PCIe architecture. For example, a root port 128 may be a PCIe root port and/or an integrated I/O device 130 may be a PCIe endpoint. A primary goal of PCIe is to enable components and devices from different vendors to inter-operate in an open architecture, spanning multiple market segments; clients (desktops and mobile), servers (standard and enterprise), and embedded and communication devices. PCIe is a high performance, general purpose I/O interconnect defined for a wide variety of future computing and communication platforms. Any suitable PCIe protocol may be used in various embodiments, such as PCIe 1.0a, 1.1, 2.0, 2.1, 3.0, 3.1, or future PCIe protocol (specifications for these protocols are available at www.pcisig.com). Some PCI attributes, such as its usage model, load-store architecture, and software interfaces, have been maintained through its revisions, whereas previous parallel bus implementations have been replaced by a highly scalable, fully serial interface. The more recent versions of PCIe take advantage of advances in point-to-point interconnects, switch-based technology, and packetized protocol to deliver new levels of performance and features. Power management, quality of service (QoS), hot-plug/hot-swap support, data integrity, and error handling are among some of the advanced features supported by PCIe. Although various embodiments may include PCIe root ports and endpoints, in other embodiments root port 128 and/or integrated I/O device 130 may utilize any suitable communication protocol.

Power control unit 120 may include any suitable logic (hardware and/or software) to receive an indication of a power loss, cause the blocking of future write requests from I/O devices 108 and/or integrated I/O devices 130, cause the flushing of pending write requests to system memory 106, and cause system memory 106 to go into self-refresh. Power control unit 120 may also provide logic for providing a signal indicating that the system memory 106 has been instructed to move to the self-refresh mode. For example, the signal may be provided to logic (e.g., CPLD 114) operable to cause BBU 116 to provide backup power to system memory 106. In some embodiments, PCU 120 may include sensors for temperature, current, and/or voltage and may optimize voltages and/or clock frequencies used by cores 118.

In various embodiments, PCU may comprise a state machine that may direct the sending of commands operable to perform the features cited above and to transition in response to signals received from other components of system 200, such as CPLD 114, memory controller 124, and/or I/O controller 122. In one embodiments, PCU comprises a microcontroller that executes embedded firmware to perform the operations described herein. In one embodiment, PCU 120 performs some or all of the PCU functions described herein using hardware without executing software instructions. For example, PCU 120 may include fixed and/or programmable logic to perform the functions of the PCU.

PCU 120 may be a component that is discrete from the cores 118A and 118B. In particular embodiments, the PCU 120 runs at a clock frequency that is different from the clock frequencies used by core 118A and 118B. In some embodiments where PCU is a microcontroller, PCU 120 executes instructions according to an ISA that is different from an ISA used by cores 118.

External I/O controller 110 may include logic (e.g., hardware and/or software) to manage the flow of data between one or more CPUs 104 and I/O devices 112. In some embodiments, external I/O controller 110 includes additional PCIe root ports and/or other integrated I/O devices, such as those described above with respect to CPU 104. In particular embodiments, external I/O controller 110 is located on a motherboard along with the CPU 104. The external I/O controller 110 may exchange information with components of CPU 104 using point-to-point or other interfaces.

CPLD 114 is a programmable logic device 114 operable to detect the onset of a loss of one or more power supplies for CPU and/or system memory 106 and to notify CPU 104 of such. The components of system 200 (e.g., CPU 104, external I/O controller 110, and/or the system memory 106) may be powered by one or more primary power sources via one or more voltage rails (or power rails) or by a backup power source, such as a battery backup unit. Each of the elements might be powered by a separate power rail and/or by common power rails. In some embodiments, a component may be powered via multiple voltage rails. A power loss in one or more of these power rails supplying power from a primary power source may be identified in any suitable manner. For example, CPLD 114 or other suitable logic may detect a drop in voltage and/or current supplied by a primary power supply. System 200 may include power circuitry that allows for provision of power to particular components of system 200 for a short duration upon power loss. For example, power circuitry of system 200 may include one or more capacitors or backup batteries that may supply power to CPU 104 (or particular components thereof) and/or system memory 106 to allow the completion of pending write requests to system memory 106 and the transition of system memory 106 to self-refresh mode, even after a power loss has occurred. In various embodiments, at least a portion of such power circuitry may be included within BBU 116 (e.g., the power circuitry could be used to power system memory 106 when it enters self-refresh mode) while in other embodiments this power circuitry may be separate from BBU 116. Upon detection of a power loss, CPLD 114 may send a power loss indication to PCU 120 of CPU 104. After PCU 120 has caused incoming write requests from I/O devices 108 and/or integrated I/O devices to be stopped, pending write requests to the system memory 106 to be completed, and system memory 106 to transition to a self-refresh mode, PCU 120 may send CPLD 114 a signal indicating that the ADR sequence is complete. CPLD 116 may then send a signal to BBU 116 to cause BBU to provide backup power to system memory 106 to allow system memory 106 to self-refresh. In some embodiments, backup power is also decoupled from the CPU at this stage.

In various embodiments, the CPLD 114 performs other functions such as monitoring whether power is available and determining whether power is stable (and may provide associated indications to other components of system 200) and controlling reset signals of components of the CPU 104 or other logic in system 200. Although, this disclosure describes functions associated with power detection and control with respect to CPLD 114, any suitable logic (fixed or programmable) may be used to provide such functionality. Moreover, such logic may be located at any suitable location within system 200 (such as within external I/O controller 110 or on the same circuit board as the external I/O controller 110 and/or CPU 104).

BBU 116 may include any suitable power source (e.g., a capacitor or battery) and control logic that enables selectable provisioning of the power source to system memory 106. In some embodiments battery backup power provided by BBU 116 is provided only to system memory 106 and not to any other part of the system, such as CPU 104 or external I/O controller 110. BBU 116 may include any suitable power circuitry, such as one or more voltage regulators powered by a battery.

Figure 3:
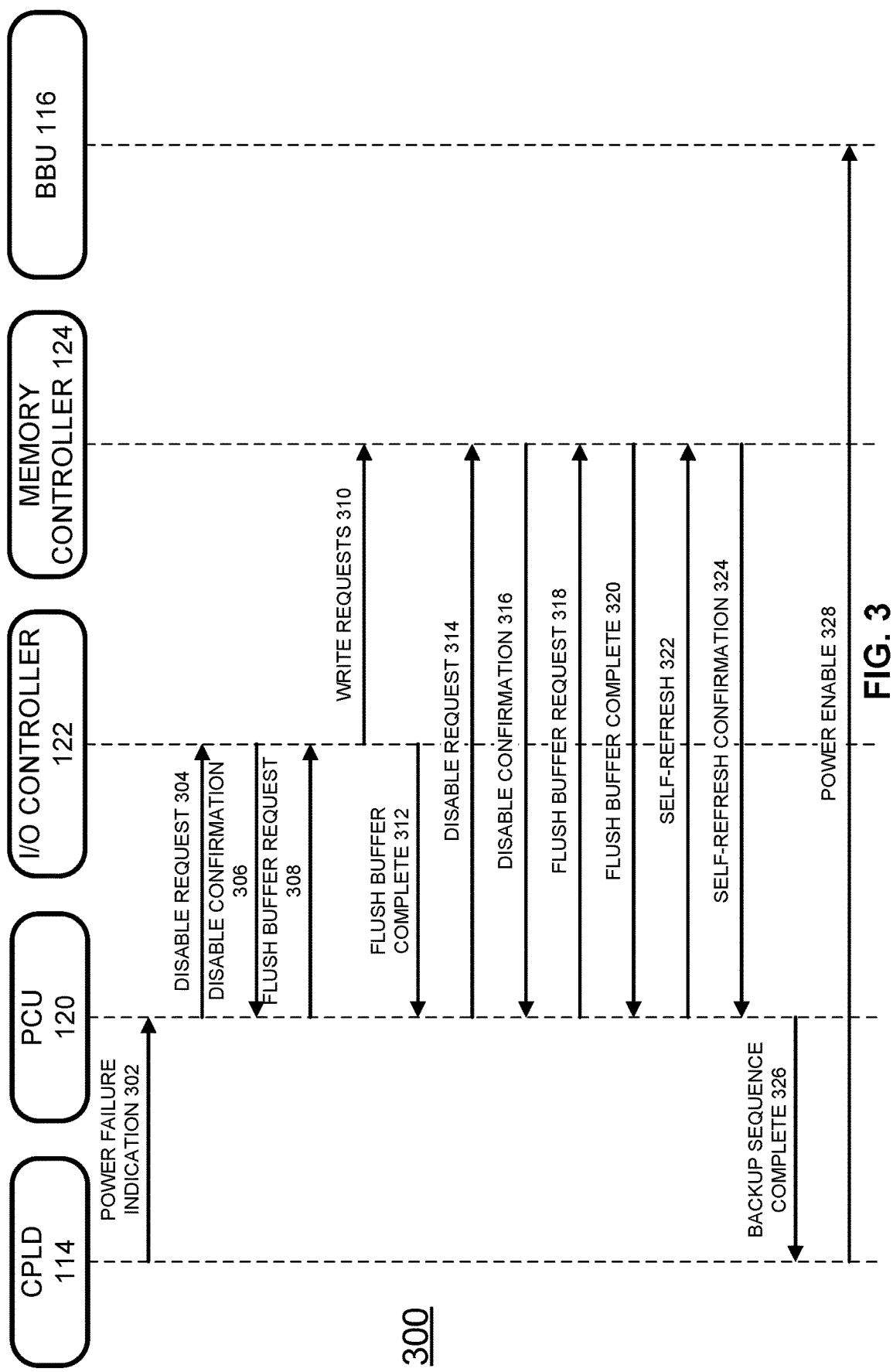
FIG. 3 illustrates a signal flow diagram illustrating example communications between components of FIG. 2 in accordance with certain embodiments.

FIG. 3 illustrates a signal flow diagram illustrating example communications between components of FIG. 2 in accordance with certain embodiments. Upon detection of a power loss, CPLD 114 sends power loss indication 302 to PCU 120. The PCU 120 then sends disable request 304 to the I/O controller 122 to block additional write requests from I/O devices 108 and/or integrated I/O devices 130. For example, links to the root ports 128 and integrated I/O devices 130 may be disabled in response to the requests 304. One or more disable confirmations 306 may be received from the root ports 128 and integrated I/O devices 130 via the I/O controller 122, verifying that incoming write requests are now being blocked. In one embodiment, PCU 120 reads a register associated with a particular link or device to verify that the link or device has been disabled.

At step 308, PCU 120 sends flush buffer request 308 to I/O controller 122. In response, I/O controller 122 may transfer all pending write requests 310 stored in write buffer 126 to the memory controller 124. The I/O controller 122 may send PCU 120 a flush buffer complete signal 312 once the write requests 310 have been moved to write buffer 132 of memory controller 124. Alternatively, PCU 120 may wait a predetermined period of time to allow the write requests to be transferred without receiving a confirmation signal.

PCU 120 then sends a disable request 314 to memory controller 124 to prevent the memory controller from accepting additional write requests. Memory controller 124 sends disable confirmation 316 back to the PCU 120 once it has blocked incoming requests. The PCU 120 then sends a flush buffer request 318 to the memory controller 124 to instruct memory controller 124 to complete the pending write requests stored in write buffer 132. The writes are performed in system memory 106 and then the memory controller 124 sends a flush buffer complete signal 320 to the PCU. The PCU 120 then sends a self-refresh command 322 to memory controller 124 to instruct the memory controller to place the system memory 106 into a self-refresh mode. Memory controller 124 then sends a self-refresh confirmation signal 324 to the PCU 120. In alternative embodiments, instead of receiving confirmation signals from the memory controller 124, the PCU 120 may simply wait for a predetermined period of time before sending the next communication. In yet other embodiments, communications 314, 318, and/or 322 may be combined into one or more communications between the PCU 120 and memory controller 124.

Upon reception of a self-refresh confirmation signal 324 (or after waiting a predetermined period of time), PCU 120 sends a backup sequence complete signal 326 to CPLD 114 which then sends a power enable signal 328 to the BBU 116 which provides power to system memory 106 in response to receiving the power enable signal.

The signals described in FIG. 3 are merely representative of communications that may be sent in particular embodiments. In other embodiments, for example, the PCU 120 may not receive one or more of the confirmation signals verifying that the actions requested by the PCU 120 have been completed. In such embodiments, PCU 120 may simply send a command after an appropriate time has passed for the previous command to be performed. In other embodiments, additional signals may be sent among the components of system 200. For example, if a confirmation signal that a particular action has been performed is not received within a certain period of time by the PCU 120, the PCU 120 may send an error signal to the CPLD (or may forego the sending of the backup sequence complete signal 326). Various embodiments of the present disclosure contemplate any suitable signaling mechanisms for accomplishing the functions described herein.

Figure 4:
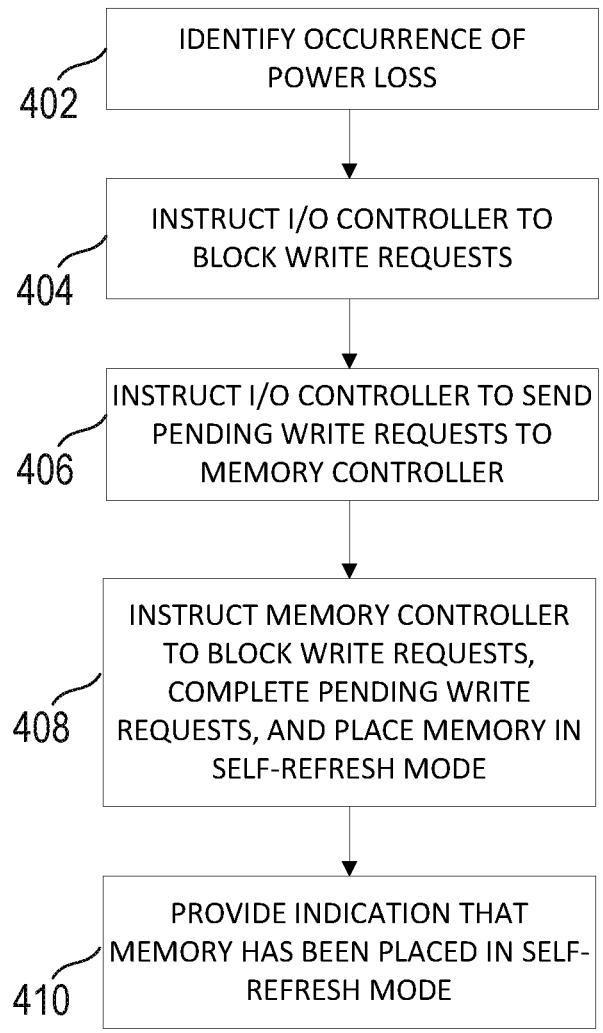
FIG. 4 illustrates a method for completing pending write requests and putting memory into self-refresh mode in accordance with certain embodiments.

FIG. 4 illustrates a method 400 for completing pending write requests and putting system memory 106 into self-refresh mode during power loss in accordance with certain embodiments. The various steps of method 400 may be performed by any suitable logic of CPU 104, such as PCU 120 (although the steps below will be explained with respect to the PCU, any other suitable logic may perform the steps).

At step 402, the occurrence of a power loss associated with CPU 104 and/or system memory 106 is identified. In some embodiments, PCU 120 identifies the power loss in response to a signal received by logic that detects the power loss (e.g., CPLD 114). In other embodiments, PCU 120 itself identifies the power loss by detection of a drop in voltage and/or current of a power source.

At step 404, the I/O controller 122 is instructed to block write requests. For example, each downstream root port 128 or integrated I/O device 130 may be disabled within I/O controller 122 to block further incoming write requests.

At step 406, the I/O controller 122 is instructed to send pending write requests to the memory controller 124. For example, I/O controller 122 may buffer write requests received from I/O devices 108 and integrated I/O devices 130 in a write buffer 126. Upon receiving a command from the PCU 120, the I/O controller 122 may send the contents of the write buffer to the memory controller 124.

At step 408, the memory controller 124 is instructed to block write requests, complete pending write requests, and place system memory 106 into self-refresh mode. In various embodiments, PCU 120 may wait a predetermined period of time (or wait until a confirmation from the I/O controller is received) to ensure that the write requests from the I/O controller 122 have reached the memory controller 124 before instructing the memory controller 124 to block incoming write requests. After blocking incoming write requests, memory controller 124 completes any pending write requests stored in write buffer 132 by writing the specified data in the requests to system memory 106. Memory controller 124 then causes system memory 106 to enter self-refresh mode. The memory controller 124 may then send a confirmation signal indicating that the memory has been placed into self-refresh mode to PCU 120. At step 410, an indication that memory has been placed in self-refresh mode is provided. For example, PCU 120 may send the indication to logic in communication with the BBU 116, such as CPLD 114. In response to receiving this indication, the CPLD 114 (or other suitable logic) may cause the battery backup unit 116 to provide backup power to system memory 106 such that system memory 106 may periodically refresh its data while waiting for power to be restored within system 200. In some embodiments, the CPLD 114 (or other suitable logic) may also cause power to the CPU 104 and external I/O controller 110 to be cut off once the system memory enters self-refresh (e.g., this may be performed in response to the indication received from the PCU 120).

Some of the steps illustrated in FIG. 4 may be repeated, combined, modified or deleted where appropriate, and additional steps may also be added to the flowchart. Additionally, steps may be performed in any suitable order without departing from the scope of particular embodiments.

Figure 5:
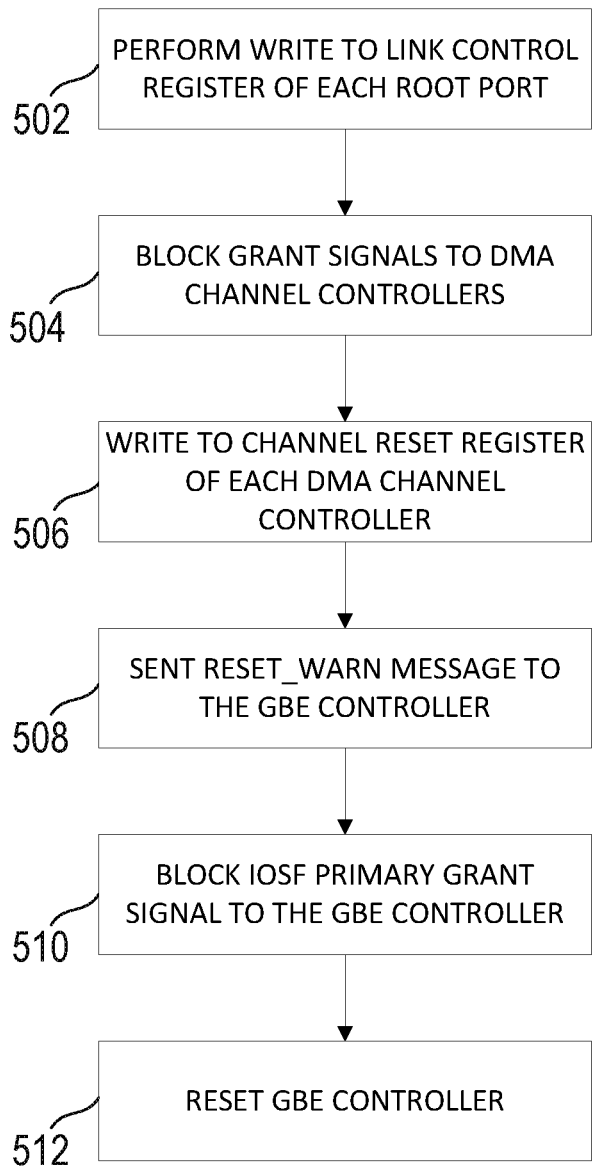
FIG. 5 illustrates a method for blocking incoming write requests during power loss in accordance with certain embodiments.

FIG. 5 illustrates a method 500 for blocking incoming write requests during power loss in accordance with certain embodiments. Method 500 is one example illustrating how the I/O controller 122 may be instructed to block write requests in a particular implementation of CPU 104 having one or more I/O devices 108 coupled to root ports 128 and integrated I/O devices 130 comprising DMA and Gigabit Ethernet (GbE) controllers coupled to root ports 128 via Intel On-Chip System Fabric (IOSF) primary bridges. However, in other embodiments, any suitable methods for blocking incoming write requests may be used (e.g., writing to bus master enable bits on the I/O devices).

At step 502, a write is performed to a link control register (e.g., a link disable bit) of each root port 128. This may cause a Link Training and Status State Machine (LTSSM) of the root port 128 to disable the link between the root port and one or more I/O devices 108 coupled to that root port. This blocks any further traffic from the I/O devices 108 through that root port.

At step 504, grant signals to each DMA channel controller are blocked. In order for a DMA request to reach the memory controller 124, an arbiter within the I/O controller 122 must provide a grant signal to the DMA engine. When the grant signals are withheld, the DMA channel controller is unable to send new requests through the I/O controller 122. Thus, new requests will be withheld, even in the event that the DMA engine reboots before the CPU 104 is powered down after the DMA engine is reset in step 506.

At step 506, writes to the channel reset register of each DMA channel controller are performed. This may terminate the ongoing DMA transfers at the nearest chunk boundary (e.g., 64 bytes). Before proceeding, PCU 120 may verify that the channel is in reset.

A similar flow is followed for the GbE controller. At step 508, a reset_warn message is sent to the GbE controller to prepare the controller for a reset. At step 510, an IOSF primary grant signal to the GbE controller is blocked. This will prevent future requests from the GbE controller from being granted by the I/O controller 122, thus preventing these requests from making forward progress. At step 512, the GbE controller is reset.

Some of the steps illustrated in FIG. 5 may be repeated, combined, modified or deleted where appropriate, and additional steps may also be added to the flowchart. Additionally, steps may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 118A0 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Various embodiments may provide an apparatus, a system, hardware- and/or software-based logic, or a non-transitory machine readable medium (including information to represent structures, when manufactured, to be configured) to comprise a processor and a power control unit. The power control unit is to, upon detection of a power loss from a primary power source, communicate with an input/output (I/O) controller to disable requests from I/O devices to write data to a volatile memory; request that all pending write requests received from the I/O devices be written to the volatile memory; and cause the volatile memory to be placed into a self-refresh mode after the pending write requests are written to the volatile memory.

In at least one example, the power control unit is further to instruct a memory controller to block incoming write requests from the I/O devices prior to the pending write requests being written to the volatile memory.

In at least one example, the power control unit is further to send an indication that the volatile memory has been placed into the self-refresh mode to logic coupled to a backup power source for the memory.

In at least one example, communicating with the I/O controller to disable requests from I/O devices comprises disabling one or more links to the I/O devices.

In at least one example, communicating with the I/O controller to disable requests from I/O devices comprises resetting an I/O device of the I/O devices.

In at least one example, communicating with the I/O controller to disable requests from I/O devices comprises writing to a control register of a root port of the I/O controller.

In at least one example, the processor core, power control unit, and I/O controller are on the same integrated circuit die.

In at least one example, communicating with the I/O controller to disable requests from I/O devices comprises instructing an arbiter of the I/O controller to block a grant signal to an integrated I/O device.

In at least one example, the I/O controller comprises at least one Peripheral Component Interconnect Express (PCIe) root port.

In at least one example, the I/O controller comprises at least one PCIe endpoint integrated on the same integrated circuit die as the processor core.

Various embodiments may provide an apparatus, a system, a machine readable storage, a machine readable medium, hardware- and/or software-based logic, a method, or a non-transitory machine readable medium (including information to represent structures, when manufactured, to be configured) to upon detection of a power loss from a primary power source, communicate with an input/output (I/O) controller to disable requests from I/O devices to write data to a volatile memory; request that all pending write requests received from the I/O devices be written to the volatile memory; cause the volatile memory to be placed into a self-refresh mode after the pending write requests are written to the volatile memory; and provide, to logic controlling the provision of a backup power source to the volatile memory, an indication that the volatile memory has been placed into the self-refresh mode.

In at least one example, a memory controller is instructed to block incoming write requests from the I/O devices prior to the pending write requests being written to the volatile memory.

In at least one example, the backup power source is provided to the volatile memory after the volatile memory is placed into the self-refresh mode.

In at least one example, communicating with the I/O controller to disable requests from I/O devices to write data to the volatile memory comprises disabling one or more links to the one or more I/O devices.

In at least one example, communicating with the I/O controller to disable requests from I/O devices to write data to the volatile memory comprises writing to a control register of a root port of the I/O controller.

Various embodiments may provide an apparatus, a system, hardware- and/or software-based logic, or a non-transitory machine readable medium (including information to represent structures, when manufactured, to be configured) to comprise a processor core, a volatile memory, a memory controller to be coupled to the volatile memory, an input/output (I/O) controller to be coupled to the memory controller, a display, and a power control unit. The power control unit is to, upon detection of a power loss from a primary power source, communicate with the I/O controller to disable requests from I/O devices to write data to the volatile memory; request that all pending write requests received from the I/O devices be written to the volatile memory; and cause the volatile memory to be placed into a self-refresh mode after the pending write requests are written to the volatile memory.

In at least one example, the power control unit is further to instruct the memory controller to block incoming write requests prior to completing pending write requests stored by the memory controller.

In at least one example, a battery backup unit is to provide a backup power source to the volatile memory after the volatile memory is placed into the self-refresh mode.

In at least one example, communicating with the I/O controller to disable requests from the I/O devices to write data to the volatile memory comprises disabling one or more links to the I/O devices.

In at least one example, communicating with the I/O controller to disable requests from the I/O devices to write data to the volatile memory comprises writing to a control register of a root port of the I/O controller.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a processor core; and
   a power control unit to, in response to a detection of a power loss from a primary power source:
   instruct an input/output (I/O) controller to disable requests from I/O devices to write data to a system memory;
   instruct a memory controller to block incoming write requests in response to receiving an indication from the I/O controller that the I/O controller has sent pending write requests to the memory controller, wherein the memory controller couples the processor core to the system memory; and
   after instructing the I/O controller to disable requests from the I/O devices and instructing the memory controller to block incoming write requests from the I/O devices, send a request to the memory controller for all pending write requests received from the I/O devices to be written to the system memory.

2. The apparatus of claim 1, the power control unit further to cause the system memory to be placed into a self-refresh mode after the pending write requests are written to the system memory.

3. The apparatus of claim 2, wherein the power control unit is further to send an indication that the system memory has been placed into the self-refresh mode to logic coupled to a backup power source for the system memory.

4. The apparatus of claim 1, wherein instructing the I/O controller to disable requests from I/O devices comprises disabling one or more links to the I/O devices.

5. The apparatus of claim 1, wherein instructing the I/O controller to disable requests from I/O devices comprises resetting an I/O device of the I/O devices.

6. The apparatus of claim 1, wherein instructing the I/O controller to disable requests from I/O devices comprises writing to a control register of a root port of the I/O controller.

7. The apparatus of claim 1, wherein instructing the I/O controller to disable requests from I/O devices comprises instructing an arbiter of the I/O controller to block a grant signal to an integrated I/O device.

8. The apparatus of claim 1, wherein the I/O controller comprises at least one Peripheral Component Interconnect Express (PCIe) root port.

9. The apparatus of claim 1, wherein the I/O controller comprises at least one PCIe endpoint integrated on the same integrated circuit die as the processor core.

10. The apparatus of claim 1, wherein the power control unit is to send the request to the memory controller for all pending requests received from the I/O devices to be written to the system memory in response to receiving an indication from the memory controller that the memory controller is to block incoming write requests.

11. The apparatus of claim 1, wherein the power control unit is further to send a flush buffer request to the I/O controller to flush pending requests to the memory controller in response to receiving an indication from the I/O controller that the I/O controller is to disable requests from I/O devices to write data to a system memory.

12. The apparatus of claim 1, further comprising the system memory.

13. The apparatus of claim 12, further comprising a display or a network adapter coupled to the processor core.

14. A method comprising:
in response to a detection of a power loss from a primary power source:
instructing an input/output (I/O) controller to disable requests from I/O devices to write data to a system memory;
instructing a memory controller to block incoming write requests in response to receiving an indication from the I/O controller that the I/O controller has sent pending write requests to the memory controller, wherein the memory controller couples a processor core to the system memory; and
after instructing the I/O controller to disable requests from the I/O devices and instructing the memory controller to block incoming write requests from the I/O devices, sending a request to the memory controller for all pending write requests received from the I/O devices to be written to the system memory.

15. The method of claim 14, further comprising causing the system memory to be placed into a self-refresh mode after the pending write requests are written to the system memory.

16. The method of claim 14, further comprising sending the request to the memory controller for all pending requests received from the I/O devices to be written to the system memory in response to receiving an indication from the memory controller that the memory controller is to block incoming write requests.

17. A system comprising:
a processor core;
means for detecting a power loss from a primary power source;
means for instructing an input/output (I/O) controller to disable requests from I/O devices to write data to a system memory;
means for instructing a memory controller to block incoming write requests in response to receiving an indication from the I/O controller that the I/O controller has sent pending write requests to the memory controller, wherein the memory controller couples the processor core to the system memory; and
means for sending a request to the memory controller for all pending write requests received from the I/O devices to be written to the system memory after instructing the I/O controller to disable requests from the I/O devices and instructing the memory controller to block incoming write requests from the I/O devices.

18. The system of claim 17, further comprising means for causing the system memory to be placed into a self-refresh mode after the pending write requests are written to the system memory.

19. The system of claim 18, further comprising means for providing a backup power source to the system memory after the system memory is placed into the self-refresh mode.

* * * * *